(12) United States Patent
Palmqvist et al.

(10) Patent No.: US 8,440,327 B2
(45) Date of Patent: May 14, 2013

(54) METHOD OF PRODUCING A LAYER BY ARC-EVAPORATION FROM CERAMIC CATHODES

(75) Inventors: Jens-Petter Palmqvist, Vasteras (SE); Jacob Sjolen, Fagersta (SE); Lennart Karlsson, Fagersta (SE)

(73) Assignee: Seco Tools AB, Fagersta (SE)

( * ) Notice: Subject to any disclaimer, the term of this patent is extended or adjusted under 35 U.S.C. 154(b) by 198 days.

(21) Appl. No.: 12/678,513

(22) PCT Filed: Sep. 17, 2008

(86) PCT No.: PCT/SE2008/051039
§ 371 (c)(1),
(2), (4) Date: Sep. 3, 2010

(87) PCT Pub. No.: WO2009/038532
PCT Pub. Date: Mar. 26, 2009

(65) Prior Publication Data
US 2010/0322840 A1   Dec. 23, 2010

(30) Foreign Application Priority Data
Sep. 17, 2007   (SE) ........................................ 0702054

(51) Int. Cl.
*B32B 9/00* (2006.01)
*C23C 14/06* (2006.01)
(52) U.S. Cl.
USPC ................... 428/697; 204/192.1; 204/192.15; 204/192.38; 204/298.13; 428/698; 428/699

(58) Field of Classification Search ............... 204/192.1, 204/192.15, 192.38, 298.12, 298.13; 428/697, 428/698, 699
See application file for complete search history.

(56) References Cited

U.S. PATENT DOCUMENTS

| 5,328,875 | A  | * | 7/1994 | Ueda et al. ........................ 51/307 |
| 6,013,322 | A  | * | 1/2000 | Barsoum et al. ............... 428/702 |
| 6,231,969 | B1 | * | 5/2001 | Knight et al. ................. 428/697 |
| 6,903,313 | B2 | * | 6/2005 | Sundberg et al. ............. 219/553 |
| 7,067,203 | B2 | * | 6/2006 | Joelsson et al. ............... 428/697 |
| 7,402,206 | B2 | * | 7/2008 | Isberg et al. .................... 117/84 |

(Continued)

FOREIGN PATENT DOCUMENTS

| EP | 1 174 528 A2 | 1/2002 |
| EP | 1 378 304 A2 | 1/2004 |

(Continued)

OTHER PUBLICATIONS

International Search Report, dated Dec. 17, 2008, from corresponding PCT application.

(Continued)

*Primary Examiner* — Archene Turner
(74) *Attorney, Agent, or Firm* — Young & Thompson

(57) ABSTRACT

A method of producing hard wear resistant layer with improved wear resistance. The method is a reactive arc-evaporation based process using a cathode including as main constituent at least one phase of a refractory compound $M_{n+1}AX_n$ (n=1, 2 or 3), wherein M is one or more metals selected from the groups IIIB, IVB, VB, VIB and VIIB of the periodic table of elements, A is one or more elements selected from the groups IIIA, IVA, VA and VIA of the periodic table of elements, and wherein X is carbon and/or nitrogen.

9 Claims, 2 Drawing Sheets

U.S. PATENT DOCUMENTS

| | | | |
|---|---|---|---|
| 7,553,564 B2* | 6/2009 | Gupta et al. | 428/699 |
| 7,786,393 B2* | 8/2010 | Isberg et al. | 428/698 |
| 2005/0132957 A1* | 6/2005 | El-Raghy et al. | 118/500 |
| 2006/0093860 A1 | 5/2006 | Schuisky et al. | |
| 2007/0224350 A1* | 9/2007 | Schuisky | 427/251 |
| 2009/0047510 A1* | 2/2009 | Schuisky et al. | 427/249.15 |

FOREIGN PATENT DOCUMENTS

| | | |
|---|---|---|
| SE | 529 426 C2 | 8/2007 |
| WO | 02/51208 A1 | 6/2002 |
| WO | 03/046247 A1 | 6/2003 |
| WO | 2005/038985 A2 | 4/2005 |
| WO | 2005/061759 A1 | 7/2005 |
| WO | 2006/057618 A2 | 6/2006 |

OTHER PUBLICATIONS

Abstract of C. Walter et al., "Toward large area deposition of Cr2A1C on steel", Thin Solid Films, 2006, pp. 389-393, vol. 515.

Alami et al: "High-power impulse magnetron sputtering of Ti-Si-C thin films from a Ti3SiC2 compound target", Thin Solid Films, Elsevier-Sequoia S.A. Lausanne. CH. vol. 515. No. 4, Nov. 14, 2006, pp. 1731-1736, XP005762984, ISSN: 0040-6090, DOI: 10.1016/J. TSF.2006.06.015, p. 1732-p. 1733; figures 1.2, Cited in European Search Report.

Claudia Walter: "Simulation of Diffusion Processes in Turbine Blades and Large Area Deposition of MAX Phase Thin Films with PVD", Dissertationsschrift der Fakultat fur Georessourcen und Materialtechnik der Rheinisch-Westfalischen Technischen Hochschule Aachen, Jun. 28, 2005. pp. 1-90, XP55032631, Aachen, de Retrieved from the Internet:URL:http://www.mch.rwth-aachen. de/thesis Claudia Walter.pdf—[retrieved on Jul. 12, 2012] * p. 62-p. 65 *, Cited in European Search Report.

European Search Report, dated Jul. 12, 2012, from corresponding European application.

* cited by examiner

METHOD OF PRODUCING A LAYER BY ARC-EVAPORATION FROM CERAMIC CATHODES

The present invention relates to a method of producing hard wear resistant coatings on metal cutting tools, with improved wear resistance and simultaneously a reduced tendency for adhesion of counterpart materials, so called built up edge during metal cutting. The method to deposit the coating is arc-evaporation based on special deposition conditions and the use of a cathode comprising at least one phase of a refractory compound of MAX-phase type. By "MAX-phase" as used herein is meant a material comprising $M_{n+1}AX_n$ (n=1, 2, 3) wherein M is one or more metals selected from the groups IIIB, IVB, VB, VIB and VIIB of the periodic table of elements and/or their mixture, A is one or more elements selected from the groups IIIA, IVA, VA and VIA of the periodic table of elements and/or their mixture, and wherein X is carbon and/or nitrogen. Consequently, examples of compounds within the MAX-phase group are $Ti_3SiC_2$, $Ti_2AlC$ and $Ti_2AlN$.

PVD (Physical Vapour Deposition) deposited wear resistant coatings, particularly of TiN, Ti(C,N), (Ti,Al)N, on cemented carbide cutting tools used for machining by chip removal have been industrially produced for a long period. TiN was the material that initially was used as the only wear resistant coating material. It has been developed by addition of new elements and adjustment of process parameters in general. TiN was followed by Ti(C,N), which is more resistant against abrasive wear than TiN and later on TiN was alloyed with Al into (Ti,Al)N, which has better high temperature properties etc. During the last couple of years, (Ti,Si)N has drawn a huge interest in the field of wear resistant coatings. Extreme hardness and very good high temperature properties have made it into one of the most exciting materials in the world of wear resistant coatings. Reports are showing that the hardness increase compared to TiN is more than 70% and the thermal stability exceeds 900° C.

One common method of PVD deposition is arc-evaporation. Some of the major advantages of using arc evaporation technique for coating cutting tools are high deposition rate and high degree of ionization in the plasma. The highly ionized plasma enables the possibility to produce metastable materials to a higher extent than what would be possible using other techniques. However, during coating using arc evaporation technique formation of macroparticles in the coatings makes the surfaces rougher than with other techniques, such as sputtering. During conventional arc-evaporation processes using metallic cathodes, reactive gas to alloy the cathode surface and strong magnetic fields are used to make the arc move faster and hence reduce the amount of macroparticles in the layers produced. Using metallic cathodes, the macroparticles will essentially be metallic. By the use of ceramic cathodes the macroparticles will to a lower extent be metallic in the deposited layer.

There are also limitations to what materials that can be deposited. Since the process utilises high current and low voltage, the cathode materials have to be good electrical conductors and withstand thermal shocks. Favourable for arc evaporation is a dense cathode and relatively small grain size with uniform element distribution. These conditions are basically limiting the process to evaporation of metallic cathodes. There are a number of problems related to the manufacturing as well as the arc evaporation process of alloyed cathodes especially Si-containing compositions. These problems are mainly related to the intermetallic phases formed in the cathodes, giving rise to an undesired brittle behaviour which makes them difficult to machine to desired shape and dimension.

Cathodes containing ceramic compounds as SiC, $SiN_x$, AlN and $Al_2O_3$ can not be used for arc evaporation processes due to uneven material distribution in the flux from the cathode as well as unstable conditions on the cathode surface.

Other commonly used PVD-techniques are direct current (DC)-magnetron sputtering and radio frequency (r.f.)-sputtering. These methods operate at high voltage and low current and smooth surfaces of the layers can be achieved with these techniques. R.f.-sputtering is pulsed at radio frequency and can even be used to evaporate insulating target materials. The major drawback of these techniques is that the deposition rate is considerably lower (50% or less) and the degree of ionized species in the plasma is less than 10%, compared to almost 100% using arc evaporation. The layers produced with these techniques are generally closer to thermal equilibrium than what is the case for arc evaporated layers. This is why metastable layers such as (Ti,Al)N with NaCl-structure with high Al-content is difficult to achieve by using r.f.- or DC-sputtering. Also, due to the low degree of ionisation the possibilities to fine tune the coating properties are more limited compared to arc evaporation.

Yet another deposition method is electron beam evaporation. This method requires unalloyed metals which are melted in a crucible and then evaporated. This method is not suited for evaporation of MAX-phase materials.

$Ti_3SiC_2$ is one material of the MAX-phase family and is known for its remarkable properties. It is easily machined, thermal shock resistant, damage tolerant, tough, and strong at high temperatures, oxidation resistant and corrosion resistant. This material is being considered for several applications such as electric heaters, WO 02/51208, for coating of cutting inserts, EP 1378304 and as a carrier body for coating cutting tools for chip removal, EP 1709214.

WO 03/046247 discloses a method of synthesizing or growing a compound having the general formula $M_{n+1}AX_n$ where M is a transition metal, n is 1, 2, 3 or higher, A is an A-group element and X is C, N or both, which comprises the step of exposing a substrate to gaseous components and/or components vaporized from at least one solid source whereby said components react with each other to produce the $M_{n+1}AX_n$.

WO 2005/038985 discloses an element for making an electric contact coated with a layer comprising a multielement material that can be described as MAX-phase.

EP 1378304 discloses a cutting tool insert comprising a substrate and a coating. The coating is composed of one or more layers of refractory compounds of which at least one layer comprises a MAX-phase.

EP 1174528 discloses a multilayer-coated cutting tool comprising a cutting tool substrate, and a multilayer coating comprising a first hard layer formed on the substrate and a second hard layer formed on the first hard layer, the first hard layer comprising one or more of Ti, Al and Cr, and one or more of N, B, C and O; and the second hard coating layer comprising Si and one or more of Groups IVB, VB and VIB of the Periodic Table and Al, and one or more of N, B, C and O.

It has been published by several authors methods to make $Ti_3SiC_2$ layers. E.g. Emmerlich et al. (J. Appl. Phys., Vol. 96, No 9, 1 Nov. 2004, p. 4817) have made it by dc magnetron sputtering of elemental targets of Ti, Si and C. Palmquist et al. (Appl. Phys. Lett., Vol. 81, No. 5, 29 Jul. 2002, p. 835) has reported deposition using magnetron sputtering from Ti$_3$SiC$_2$-compound target and by sputtering from elemental targets of Ti and Si co-evaporated with C$_{60}$ (fullerene) as carbon source.

Flink et al. (Surf. Coat. Technol., Vol. 200, 2005, p. 1535) have reported that for NaCl-structured (Ti,Si)N layers deposited by arc evaporation, the layer hardness increases almost linearly with increasing Si content. Also, the high temperature stability measured as the retained room temperature hardness after annealing at elevated temperature was remarkably good. These layers were prepared using (Ti,Si)-cathodes.

It is an object of the present invention to provide a method of producing hard wear resistant layers with cubic NaCl-structure or nanocomposite structure from a cathode with good thermal, electrical and mechanical properties.

It is a further object of the present invention to provide cutting tool coated with a layer with high Si-content and a low amount of metallic macro particles.

FIGURE CAPTIONS

FIG. 1a shows SEM (Scanning Electron Microscopy) micrograph top view of the layer of prior art variant and FIG. 1b according to the invention. An example of a macro particle is indicated by an arrow in FIG. 1a.

DEFINITIONS

Figure 1A:
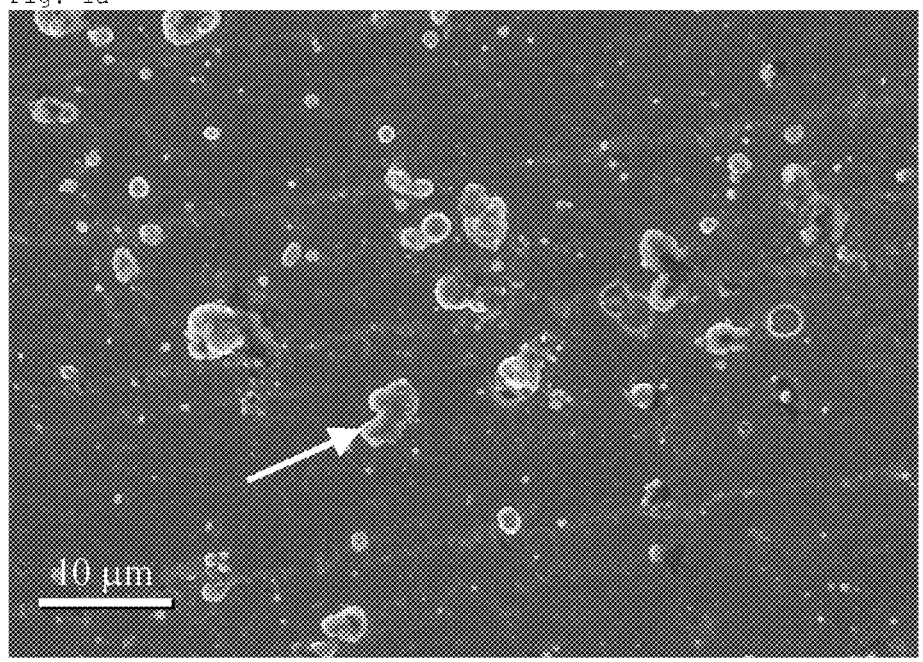

In the following description we will use terms as follows:

TiSiMeCNO-layer(s) define(s) a layer comprising a NaCl-structure phase and a overall composition (Ti,Si,Me)(C,N,O) with a high Si to Ti ratio, 30 at-%>Si/(Si+Ti+Me)>15 at-%, preferably 25 at-%>Si/(Si+Ti+Me)>20 at-% deposited using arc-evaporation technique and a cathode containing MAX-phase material defined as a material comprising $M_{n+1}AX_n$ (n=1, 2, 3) wherein M is one or more metals selected from the groups IIIB, IVB, VB, VIB and VIIB of the periodic table of elements and/or their mixture, A is one or more elements selected from the groups IIIA, IVA, VA and VIA of the periodic table of elements and/or their mixture, and wherein X is carbon and/or nitrogen.

DETAILED DESCRIPTION OF THE INVENTION

By using special deposition conditions and a cathode comprising a MAX-phase, it has been found possible to keep the benefits of arc-evaporation and to deposit layers on metal cutting tools, e.g. cemented carbide, cermet, PCBN, HSS, especially high Si-containing layers, with good wear resistance and simultaneously a reduced tendency for built up edge and thereby avoid the drawbacks of the prior art methods.

The method can also be used to deposit layers on electrical contacts.

The cathode may be comprised by several different parts of which at least the outermost part, that will be evaporated, is composed of MAX-phase.

Another important aspect of this method is the possibility of large scale manufacturing cathodes with high Si to Ti ratio. By the use of Ti$_3$SiC$_2$ material the cathode surface gives the benefit of rapid arc movement with less influence of the deposition atmosphere and other process data used, giving rise to smooth layers.

According to a preferred embodiment the Ti$_3$SiC$_2$-phase is used as cathode material. Surprisingly, the Ti$_3$SiC$_2$ cathode shows no tendency to any of the disadvantages expected as uneven material distribution in the flux from the cathode, as well as unstable condition on the cathode surface and brittleness from a cathode containing a ceramic compound or a compound cathode with a high Si-content.

The cathode shall preferably comprise the MAX-phase Ti$_3$SiC$_2$ for Ti—Si containing layers. For other Si-containing layers M$_2$SiX, M$_3$SiX$_2$, M$_4$SiX$_3$ where M is one or more of Zr, Hf, V, Nb, Ta, Cr or Mo and X is N and/or C can be used.

The method used in present invention to synthesize wear resistant TiSiMeCNO-layers is based on arc evaporation technique from a cathode, according to above, preferably mainly consisting of Ti$_3$SiC$_2$. One benefit of using Ti$_3$SiC$_2$ in arc evaporation processes compared to other similar materials is the relatively high content of Si. The Si/(Si+Ti)-ratio is 25 at % using a Ti$_3$SiC$_2$ cathode.

The TiSiMeCNO-layer can be deposited directly onto the substrate as a single layer with a coating thickness of 0.3-10 µm.

The TiSiMeCNO-layer can also be combined in the same deposition process with one or more layers of Me(N,C,O) where Me is one or more of Ti, Zr, Hf, V, Nb, Ta, Cr, Mo and Al of 0.01 to 7.0 µm thickness and TiSiMeCNO-layers between 0.01 and 10 µm thickness and a total thickness of 0.5-20 µm, where the outermost layer is preferably a TiSiMeCNO-layer. Preferably 0.5-3 µm (Ti,Al)N+0.5-3 µm TiSiMeCNO-layer is used.

Also, a first intermediate CVD and/or MTCVD layer based on TiC and/or Ti(C,N) and/or Al$_2$O$_3$ layer(s) can be deposited onto the substrates before any TiSiMeCNO-layer(s) are deposited, with a total coating thickness of 2-40 µm.

The TiSiMeCNO-layer can beneficially be treated after deposition by brushing, blasting, drag-finishing or other similar techniques for additional improvement of the surface smoothness.

The method used to grow the TiSiMeCNO-layers of the present invention, here exemplified by the system Ti—Si—N—C—O, is based on arc evaporation from a cathode comprising a MAX-phase, preferably Ti$_3$SiC$_2$. The cathode is characterised by a grain size smaller than 200 µm, a density higher than 50%, preferably higher than 85% of theoretical density, and an electrical conductivity higher than 2E6 $\Omega^{-1}$ m$^{-1}$, a thermal conductivity higher than 25 Wm$^{-1}$K$^{-1}$, a resistance against thermal shock higher than 500° C. The amount of MAX-phase is more than 75 vol-% and remaining phases are mainly TiC, Ti$_x$Si$_y$ and SiC.

In the process of the present invention with a plasma flux consisting of an average composition of 3Ti—Si—2C, one or more reactive gas(es) such as N$_2$, CH$_4$, C$_2$H$_2$, CO, CO$_2$, O$_2$ are added and the resulting layer will have a schematic formula of (Ti,Si)(C,N,O) or any modulation there of with co-existing phases of TiC, TiN, Si$_3$N$_4$, Si$_x$N, Ti(C,N) etc, which hereby is referred to as a (Ti,Si)(C,N,O)-layer.

In a preferred embodiment, the process is carried out in reactive (N$_2$) atmosphere and/or inert atmosphere (Ar) consisting of 0-50 vol-% Ar, preferably 0-20 vol-%, at a total pressure of 0.5 Pa to 9.0 Pa, preferably 0.7 Pa to 3.0 Pa, is used.

The evaporation current ($I_E$) is between 40 A and 300 A depending on cathode size and cathode material. When using Ti$_3$SiC$_2$ cathodes of 63 mm in diameter the evaporation current is preferably between 50 A and 140 A and most preferably 60 A and 80 A.

The substrate bias ($V_s$) is between −10 V and −300 V, preferably between −10 V and −120 V and most preferably −10 V and −50 V.

The deposition temperature is between 300° C. and 700° C., preferably between 400° C. and 500° C. The optimal process parameters are dependent of the design of the deposition system and it is within the scope of the skilled artisan to determine the best conditions by experiment.

Evaporation from MAX-phase cathodes can be done simultaneously as other cathodes e.g. (Ti,Al), (Cr,Al) or combined as a multilayer or as a mixed layer. In order to get the desired composition of the layer, working with pure single element cathodes, the arc current and the number of cathodes per element have to be optimised properly.

As mentioned the set-up of the magnetic fields has to be optimised carefully for an even and rapid arc motion with a low macroparticle flux and uniform erosion rate of the cathode. For (Ti,Si)(C,N,O)-layer grown using $Ti_3SiC_2$ cathodes, surprisingly, the magnetic configuration is less critical which enables a high degree of utilization of the cathode material.

In yet another embodiment a combination process where several layers deposited consecutively in reactive and inert atmosphere are used in order to achieve a coating containing wear resistant layers and low friction layers to act as crack propagation inhibitor and to reduce built up edge.

The invention has been described with layers with high Si-content. Cathodes comprising aluminium (A=Al)$M_2AlX$, $M_3AlX_2$ $M_4AlX_3$ where M is one or more of Zr, Hf, V, Nb, Ta, Cr or Mo and X is N and/or C can be of interest when layer smoothness and low Al-content is important e.g. use of $Ti_2AlC$ as cathode.

EXAMPLE 1

Polished cemented carbide substrates with composition 93.5 wt-% WC-6 wt-% Co-0.5 wt-% (Ta,Nb)C were used for analysis of the layers. The WC grain size was about 1 μm and the hardness was 1630 $HV_{10}$. Inserts used for cutting tests SEEX1204AFTN had a composition of 86.4 wt-% WC-13 wt-% Co-0.6 wt-% Cr and a grain size of 0.8 μm.

The substrates were mounted on a fixture for one-fold rotation, rake face facing the cathodes, with a shortest cathode-to-substrate distance of 160 mm. The system was evacuated to a pressure of less than $2.0 \times 10^{-3}$ Pa, after which the substrates were sputter cleaned with Ar ions. The layers were grown using arc evaporation of $Ti_3SiC_2$ cathodes. The cathode had a diameter of 63 mm and a 6 mm rim in order to confine the arc motion to the desired area. The cathode contained the MAX-phase $Ti_3SiC_2$ to the amount of 80 vol-% and remaining phases were TiC, $Ti_xSi_y$ and SiC. The MAX-phase had an average grain size of 10 μm. The density was higher than 95% of theoretical density. The electrical conductivity was $4.5E6\ \Omega^{-1}m^{-1}$. The nitrogen pressure, temperature and evaporation current were varied according to table 1. The deposition was carried out in a 99.995% pure $N_2$, using a substrate bias of −40 V. Deposition time expressed as Ah was 150 for all layers.

The reference was made using prior art for deposition of (Ti,Si)N layers by arc evaporation of a conventionally alloyed cathode (Ti,Si) with Si/(Si+Ti) of 20 at-%.

The layers were characterised in terms of smoothness, structure and cutting performance.

The cutting test was performed in low carbon steel (AISI 1042) in a face milling application, $v_c$=250 m/min, $f_z$=0.2 mm, $a_p$=2.0 mm, and $a_e$=75 mm. The results reported are based on a combined evaluation of tool life, edge integrity, tendency for build up edge and layer adhesion expressed by the scale below the table.

| Layer | Pressure (Pa) | Dep. Temp. (° C.) | Evaporation current (A) | Process stability | Coating thickness (μm) | Crystal structure/ Texture | Surface smoothness | Cutting performance |
|---|---|---|---|---|---|---|---|---|
| A | 2.0 $N_2$ | 450 | 2 × 75 | − | 2.1 | NaCl/ 200 | + | − |
| B | 4.0 $N_2$ | 450 | 2 × 75 | − | 1.8 | NaCl/ Random | − | − |
| C | 2.0 $N_2$ | 350 | 2 × 75 | + | 2.2 | NaCl/ 200 | − | + |
| D | 4.0 $N_2$ | 350 | 2 × 75 | − | 1.9 | NaCl/ Random | − | − |
| E | 2.0 $N_2$ | 350 | 2 × 60 | + | 1.9 | NaCl/ Random | + | − |
| F | 4.0 $N_2$ | 350 | 2 × 60 | − | 1.8 | NaCl/ Random | − | − |
| G | 1.0 $N_2$ | 450 | 2 × 60 | ++ | 2.4 | NaCl/ 200 | +++ | +++ |
| H | 1.0 $N_2$ | 350 | 2 × 60 | ++ | 2.4 | NaCl/ 200 | + | ++ |
| I | 2.0 Ar | 350 | 2 × 60 | ++ | 2.6 | Intermetallic/ Random | − | − |
| Ref | 1.0 $N_2$ | 350 | 2 × 60 | + | 2.9 | Nacl/ 200 | + | + |

− = poor,
+ = good,
++ = very good,
+++ = outstanding

All layers, A to I, had a Si/(Si+Ti) ratio varying from 0.21 to 0.23 at-% measured with EDS (Energy Dispersive Spectroscopy). The reference layer had a Si/(Si+Ti) ratio of 0.18 at-%. A quantitative carbon content analysis was not possible to perform with EDS due to limitations of the method, but the analysis clearly indicated that carbon was present in the layers.

Figure 1B:
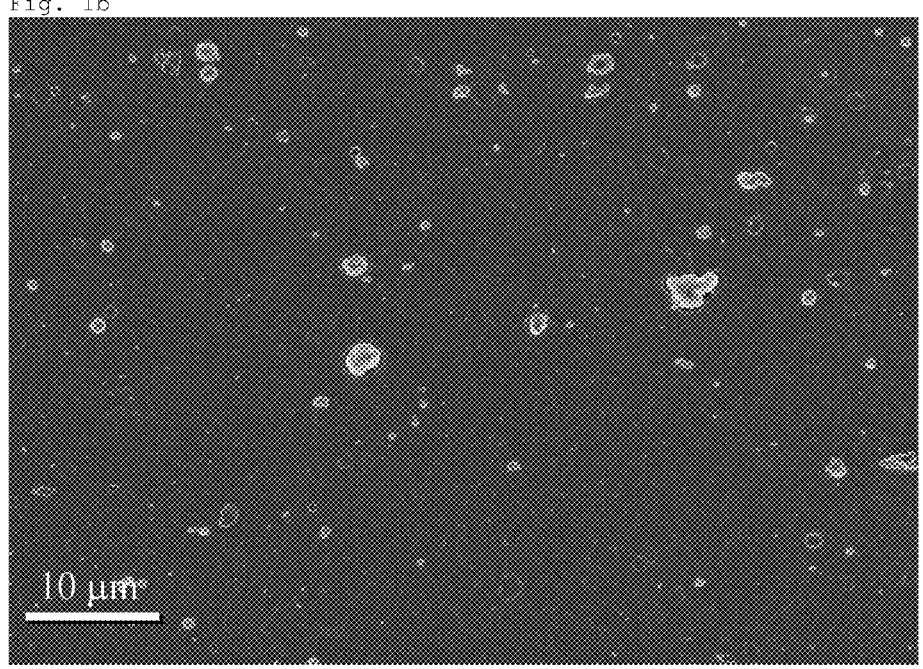

In FIG. 1a a SEM micrograph (top view) of prior art, layer Ref., is shown and in FIG. 1b layer G is shown. It is obvious that the amount of macroparticles is significantly lower on layer G. One example of a macroparticle is indicated by an arrow in FIG. 1a.

This example clearly shows that layer G performs best and that arc-evaporation from a $Ti_3SiC_2$ cathode is possible for deposition of wear resistant layers. Comparison between the FIGS. 1a and 1b also demonstrates the advantage in respect of surface smoothness of the present invention.

EXAMPLE 2

Figure 2:
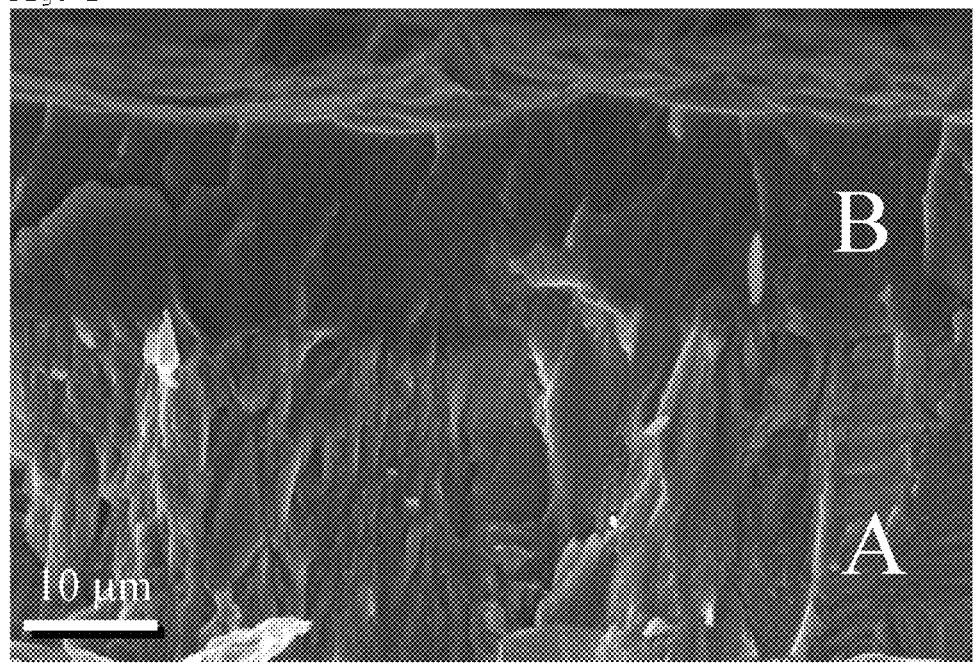
FIG. 2 shows a SEM micrograph of fracture cross section of a coated insert according to the invention, in which A=(Ti, Al)N and B=TiSiMeCNO-layer.

Turning inserts, CNMG120408-M3, consisting of 94 wt % WC, 6 wt % Co with WC grain size <1.0 μm were coated with (Ti,Al)N+(Ti,Si)(C,N)-layers in different modulations described in the table below. The (Ti,Al)N layers were deposited using arc evaporation from metallic cathodes (Al/Ti-ratio=66/34 at-%) in the same deposition cycle as the (Ti,Si)(C,N)-layers, which were deposited according to the invention. The deposition parameters for the (Ti,Al)N-layer were P=3.0 Pa, $V_s$=−80V, $I_E$=2×60 A. The deposition conditions for the (Ti,Si)(C,N)-layers were according to layer G in example 1. FIG. 2 shows a SEM micrograph of fracture cross section of a coated insert according to the invention, in which A=(Ti,Al)N and B=(Ti,Si)(C,N)-layer. The picture shows a dense structure, a good interface between top and bottom layer in combination with a smooth top surface.

The cutting test was performed in stainless steel (AISI 316L) in a turning application, $v_c$=230 m/min, f=0.2 mm, a=1.5 mm. The tool life criterion in this test was flank wear larger than 0.3 mm or breakage.

| Layer | (Ti,Al)N thickness (μm) | (Ti,Si)(C,N)-layer thickness (μm) | Tool life (min) |
|---|---|---|---|
| J | 2.2 | 0 | 14 |
| K | 1.5 | 0.7 | 20 |
| L | 1.1 | 1.1 | 20 |
| M | 0.7 | 1.5 | 14 |
| N | 0 | 2.2 | 10 |

This test clearly shows that a (Ti,Si)(C,N)-layer, in combination with other wear resistant layers, performs better than the single layers.

The invention claimed is:

1. A method of producing a layer on a substrate comprising:
depositing a layer on said substrate by a reactive arc-evaporation process using a cathode comprising as main constituent at least one phase of a refractory compound $M_{n+1}AX_n$ (n=1, 2 or 3), wherein M is one or more metals selected from the groups IIIB, IVB, VB, VIB and VIIB of the periodic table of elements, A is one or more elements selected from the groups IIIA, IVA, VA and VIA of the periodic table of elements, and wherein X is carbon and/or nitrogen.

2. The method according to claim 1 wherein A is Si.

3. The method according to claim 1 wherein M is Ti, A is Si and X is C and n is 2 such that the refractory compound is $Ti_3SiC_2$.

4. The method according to claim 1 wherein A is Al.

5. The method according to claim 1 wherein M is Ti and A is Al, X is C and n is 1 or 2 such that the refractory compound is, respectively, $Ti_2AlC$ or $Ti_3AlC_2$.

6. The method according to claim 1 wherein the cathode has a grain size smaller than 200 μm, a density higher than 50% of theoretical density, an electrical conductivity higher than $2E6$ $\Omega^{-1}m^{-1}$, a thermal conductivity higher than 25 $Wm^{-1}K^{-1}$, a resistance against thermal shock higher than 500° C. and with an amount of MAX-phase more than 75 vol-% with remaining phases mainly comprising TiC, $Ti_xSi_y$, and SiC.

7. The method according to claim 1 wherein the process is carried out in reactive atmosphere at a total pressure of 0.5 Pa to 9.0 Pa with an evaporation current ($I_E$) of 40-300 A, substrate bias ($V_s$) of −10 V to −300 V and deposition temperature of 300° C. to 700° C.

8. A reactive arc evaporation cathode comprising a main constituent of at least one phase of a refractory compound $M_{n+1}AX_n$ (n=1, 2 or 3), wherein M is one or more metals selected from the groups IIIB, IVB, VB, VIB and VIIB of the periodic table of elements, A is one or more elements selected from the groups IIIA, IVA, VA and VIA of the periodic table of elements, and wherein X is carbon and/or nitrogen.

9. A TiSiMeCNO layer comprising a NaCl-structure phase and an overall composition (Ti,Si,Me)(C,N,O), wherein,
Me is one or more of Zr, Hf, V, Nb, Ta, Cr, Mo and Al
Si, as an atomic percentage of Si, Ti and Me, is 30 at-%>Si/(Si+Ti+Me) >15 at-%,
said layer is deposited in a reactive arc-evaporation process using a cathode comprising as main phase at least one phase of a refractory compound $M_{n+1}AX_n$ (n=1, 2 or 3), wherein M is one or more metals selected from the groups IIIB, IVB, VB, VIB and VIIB of the periodic table of elements, A is one or more elements selected from the groups IIIA, IVA, VA and VIA of the periodic table of elements, and wherein X is carbon and/or nitrogen.

* * * * *

UNITED STATES PATENT AND TRADEMARK OFFICE
CERTIFICATE OF CORRECTION

PATENT NO. : 8,440,327 B2
APPLICATION NO. : 12/678513
DATED : May 14, 2013
INVENTOR(S) : Palmqvist et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 368 days.

Signed and Sealed this
Eighth Day of September, 2015

Michelle K. Lee
*Director of the United States Patent and Trademark Office*